(12) United States Patent
Carozzi et al.

(10) Patent No.: US 11,972,667 B2
(45) Date of Patent: Apr. 30, 2024

(54) ATM HAVING PRIVACY PANELS

(71) Applicant: Wincor Nixdorf International GmbH, Paderborn (DE)

(72) Inventors: Andrea Carozzi, Delbrueck (DE); Peter Golueke, Paderborn (DE)

(73) Assignee: DIEBOLD NIXDORF SYSTEMS GMBH, Paderborn (DE)

( * ) Notice: Subject to any disclaimer, the term of this patent is extended or adjusted under 35 U.S.C. 154(b) by 139 days.

(21) Appl. No.: 17/545,024

(22) PCT Filed: Jun. 24, 2020

(86) PCT No.: PCT/IB2020/055989
§ 371 (c)(1),
(2) Date: Dec. 8, 2021

(87) PCT Pub. No.: WO2020/261153
PCT Pub. Date: Dec. 30, 2020

(65) Prior Publication Data
US 2023/0274621 A1    Aug. 31, 2023

Related U.S. Application Data

(60) Provisional application No. 62/866,260, filed on Jun. 25, 2019.

(51) Int. Cl.
*G07F 19/00* (2006.01)

(52) U.S. Cl.
CPC .......... *G07F 19/201* (2013.01); *G07F 19/205* (2013.01)

(58) Field of Classification Search
None
See application file for complete search history.

(56) References Cited

U.S. PATENT DOCUMENTS 10,049,402 B1 * 8/2018 Miranda ................ G06Q 20/42
2017/0140354 A1   5/2017 Jenkins

FOREIGN PATENT DOCUMENTS

| | | |
|---|---|---|
| EP | 1579363 A1 | 9/2005 |
| WO | 2006081186 A2 | 8/2006 |

OTHER PUBLICATIONS

International Search Report filed in the corresponding PCT Application dated Sep. 10, 2020; 4 pages.
Written Opinion filed in the corresponding PCT Application dated Sep. 10, 2020; 7 pages.
International Preliminary Report on Patentability filed in the corresponding PCT Application dated Dec. 28, 2021; 8 pages.

* cited by examiner

*Primary Examiner* — Kristy A Haupt
(74) *Attorney, Agent, or Firm* — Black McCuskey

(57) ABSTRACT

An ATM can include at least one user interface, at least one computing device, and at least one privacy panel. The at least one computing device can be arranged in communication with the at least one user interface. The at least one privacy panel can be disposed on a side of the user interface. The at least one privacy panel can be configured to have a variable opacity. The at least one computing device is engaged with the at least one privacy panel to selectively vary the opacity of the at least one privacy panel.

15 Claims, 4 Drawing Sheets

ATM HAVING PRIVACY PANELS

CROSS-REFERENCE TO RELATED APPLICATIONS

This application is a National Phase filing of International Application Ser. No. PCT/IB2020/055989, for an ATM HAVING PRIVACY PANELS, filed 24 Jun. 2020. This application claims the benefit of U.S. Provisional Patent Application Ser. No. 62/866,260 for an ATM HAVING PRIVACY PANELS, filed on Jun. 25, 2020, which is hereby incorporated by reference in its entirety.

BACKGROUND

1. Field

The present generally relates to automated transaction machines (ATMs).

2. Description of Related Prior Art

ATMs are known in the prior art. ATMs are commonly used to carry out transactions such as dispensing cash, checking account balances, paying bills and/or receiving deposits from users. Other types of transaction machines may be used to sell goods, to purchase tickets, to issue coupons, to present checks, to print scrip and/or to carry out other functions either for a consumer or a service provider. ATMs are often located in crowded public areas such as supermarkets, train stations, bus stations, airports, and shopping malls.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

An ATM can include at least one user interface, at least one computing device, and at least one privacy panel. The at least one computing device can be arranged in communication with the at least one user interface. The at least one privacy panel can be disposed on a side of the user interface. The at least one privacy panel can be configured to have a variable opacity. The at least one computing device is engaged with the at least one privacy panel to selectively vary the opacity of the at least one privacy panel.

BRIEF DESCRIPTION OF THE DRAWINGS

The detailed description set forth below references the following drawings.

DETAILED DESCRIPTION

The present disclosure, as demonstrated by the exemplary embodiments described below, can enhance privacy for users of ATMs and can alert potential users of an ATM to the presence of the ATM. Privacy is desirable to the user an ATM so that sensitive information such as the user's Personal Identification Number (PIN) or account information cannot be easily viewed by another person standing nearby. At the same time, it can be desirable for an ATM to be easily visible for potential users, particularly in high-traffic areas where the ATM may be blocked by people standing or walking in front of the ATM.

Figure 1:
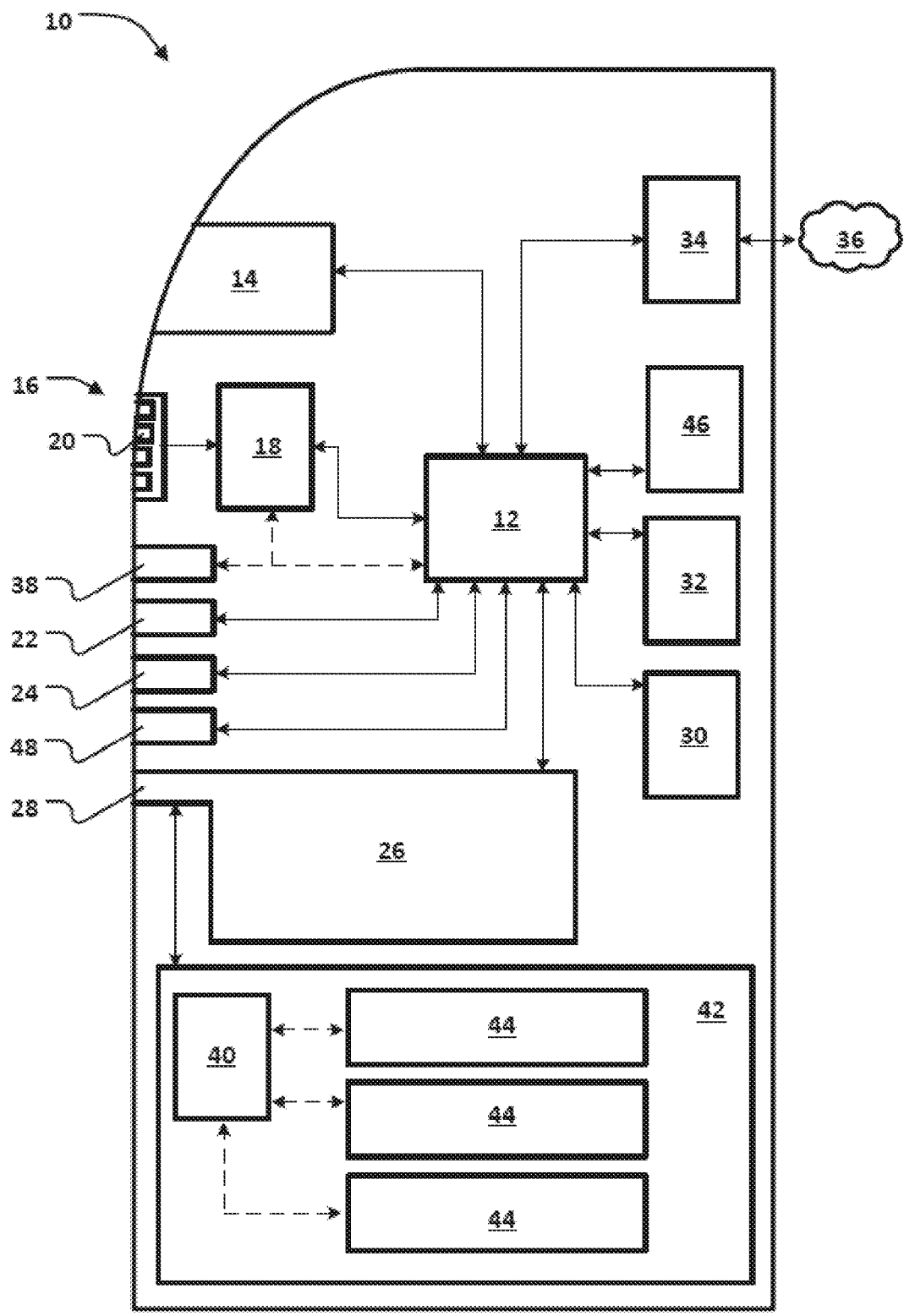
FIG. 1 is a schematic of an ATM according to an exemplary embodiment of the present disclosure.

Referring now to the drawings, FIG. 1 discloses a functional block diagram of an exemplary ATM 10 according to one or more implementations of the present disclosure. The ATM 10 includes different structures and subsystems for receiving input from a user and executing transactions. The ATM 10 includes a computing device (also referred to as a controller) 12. The exemplary computing device 12 has one or more processors and a non-transitory, computer readable medium. The computing device 12 operates under the control of an operating system, kernel and/or firmware and executes or otherwise relies upon various computer software applications, components, programs, objects, modules, data structures, etc. The exemplary computing device 12 can operate under the control of the Windows® operating system. The computer readable medium (memory) of the computing device 12 can include random access memory (RAM) devices comprising the main storage of computing device 12, as well as any supplemental levels of memory, e.g., cache memories, non-volatile or backup memories (e.g., programmable or flash memories), read-only memories, etc. In addition, the memory may be considered to include memory storage physically located elsewhere from RAM in the computing device 12, such as any cache memory in a processor, as well as any storage capacity used as a virtual memory. The computing device 12 can also include one or more mass storage devices, e.g., a floppy or other removable disk drive, a hard disk drive, a direct access storage device (DASD), an optical drive (e.g., a CD drive, a DVD drive, etc.), and/or a tape drive, among others, represented by memory 46.

The exemplary ATM 10 also includes a display 14. The computing device 12 can control the display 14 to present information to the user for furthering completion of the transaction. The display 14 can be a touch screen that allows the user to enter information through the display 14. The exemplary display 14 is configured to transmit any user-entered information to the computing device 12.

The exemplary ATM 10 also includes a key pad 16 and an encryption module 18. Generally, the combination of a key pad and an encryption module are referred to in the art as an encrypted pin pad (EPP). The exemplary key pad 16 includes a plurality of keys, such as key 20. The exemplary encryption module 18 has one or more processors and a non-transitory, computer readable medium. The user can press the keys of the key pad 16 to enter a PIN. The key pad 16 is placed in communication with the encryption module 18 and therefore the numbers of the PIN are received by the encryption module 18. It is noted that the communication of the PIN is direct and secure; the PIN cannot be intercepted between the key pad 16 and the encryption module 18. The PIN is then encrypted by the encryption module 18 to define a PIN block. The encryption module 18 includes a network encryption key and applies the network encryption key to encrypt the PIN to the PIN block. The exemplary encryption module 18 is configured to transmit the PIN block to the computing device 12, which can direct the PIN block away from the ATM 10 during the completion of a financial transaction.

The exemplary ATM 10 also includes a card reader 22. The card reader 22 can receive a token from the user, such as a card. The card reader 22 can be configured to execute read and write operations with respect to any storage medium fixed to the user's card. The exemplary card reader 22 can be configured to read data from a magnetic strip on the back of a card or a chip embedded in the card. The exemplary card reader 22 can be configured to transmit any data read from the user's card to the computing device 12, which can direct the data read from the card away from the ATM 10 during the completion of a financial transaction. The exemplary card reader 22 can also be configured to receive commands and data from the computing device 12 and change data stored on the user's card.

The exemplary ATM 10 also includes a receipt printer module 24. The computing device 12 can control the receipt printer module 24 to print a receipt when a transaction has been completed. The receipt printer module 24 can communicate one or more messages to the computing device 12, such as a maintenance message regarding the need to refill printer paper.

The exemplary ATM 10 also includes an article exchange unit 26. In the exemplary embodiment, the article exchange unit 26 is configured to receive items such as checks. An exemplary article exchange unit 26 can include a drum on which received items are stored. The exemplary article exchange unit 26 includes a slot 28 open to an exterior of the ATM 10 for the receipt of such items. In other embodiments of the present disclosure, an article exchange unit can be configured to facilitate the receipt of other items, different than paper. The article exchange unit 26 can include one or more sensors and transmit signals from any such sensors to the computing device 12 to execute an exchange. The computing device 12 can control the article exchange unit 26 in response to such signals. For example, the article exchange unit 26 can include a sensor that detects receipt of an item such as a check. The article exchange unit 26 can include a further sensor in the form of a scanner that generates an image of the received item and transmits the image to the computing device 12. When an exchange involves the dispensation of an article to the user, the computing device 12 can control the article exchange unit 26 to dispense the item(s) requested by the user.

The exemplary ATM 10 also includes a printer module 30. The printer module 30 can generate a continuous record of all transactions executed by the ATM 10. The computing device 12 can control the printer module 30 to supplement the record after each transaction has been completed. The printer module 30 can communicate one or more messages to the computing device 12, such as a maintenance message regarding the need to refill printer paper.

The exemplary ATM 10 also includes an access module 32. The access module 32 can be positioned proximate to a rear side of the ATM 10. The access module 32 can be utilized by service and support technicians. For example, the access module 32 can be utilized by a field engineer to complete software updates to the computing device 12. The access module 32 can also be utilized when non-software updates and maintenance is performed, such as the refilling of printer paper or currency.

The exemplary ATM 10 also includes a transceiver 34. The exemplary transceiver 34 is configured to facilitate communication between the computing device 12 and other computing devices that are distinct from and physically remote from the computing device 12. An example of such a remote computing device is a server computing device, such as a banking or financial institution server communicating with a plurality of ATMs. The exemplary transceiver 34 places the computing device 12 in communication with one or more networks, such as network 36. The network 36 can be a local area network (LAN), a wide area network (WAN) such as the Internet, a Multi-protocol label switching (MPLS) network, a cellular network such as operated by cellular phone companies, or any combination thereof. The network 36 can be a financial/bank network such as NYCE, PULSE, PLUS, Cirrus, AFFN, Interac, Interswitch, STAR, LINK, MegaLink, or BancNet. The transceiver 34 can transmit data and requests for input generated by the computing device 12 and receive responses to these requests, directing these responses to the computing device 12.

The exemplary ATM 10 also includes a transceiver 38. The exemplary transceiver 38 is configured to facilitate communication between at least one of the encryption module 18 and the computing device 12, with computing devices that are distinct from and physically proximate to the ATM 10. An example of such a proximate computing device is a smartphone possessed by the user. The dashed connection lines in FIG. 1 represent optional interconnections. The exemplary transceiver 38 can place the user's smartphone in communication with the encryption module 18, the computing device 12, or both. The exemplary transceiver 38 can implement various communication protocols. For example, the transceiver 38 can be a Near Field Communication (NFC) device. Alternatively, the transceiver 38 can be a Bluetooth beacon. The transceiver 38 can transmit and receive data and requests for input generated by the encryption module 18 and/or the computing device 12, such transmissions occurring with the user's smartphone for example.

The exemplary ATM 10 also includes an advanced function dispenser (AFD) 40. The AFD 40 can dispense banknotes, such as currency. The exemplary AFD 40 is positioned in a safe 42. In other embodiments, the AFD 40 can be positioned outside of the safe 42. One or more cassettes or cash boxes 44 are also positioned and protected in the safe 42. Banknotes are stored in the cassettes 44 for disbursement to a user of the ATM 10. The exemplary AFD 40 can extract the banknotes from one or more of the cassettes 44 and direct them out of the ATM 10 through the slot 28. The AFD 40 thus communicates with the slot 28 in parallel with the article exchange unit 26. The exemplary AFD 40 can communicate with and be controlled by the computing device 12 for at least some operations. Each of the cassettes 44 can engage the AFD 40 through a rack whereby the positioning of the cassettes is controlled. Further, the each of the cassettes 44 and the AFD 40 can include mating connectors of any form, whereby a positive interconnection is confirmed electronically. When one or more of the cassettes 44 and the AFD 40 are not properly interconnected, a signal or lack thereof can be communicated to the computing device 12 whereby an error message is generated or the ATM 10 can be disabled.

The exemplary ATM 10 also includes a scanner 48. The scanner 48 can scan, for example, at least a portion of a display of a smart phone and communicate the scanned display to the computing device 12. A token can be displayed on the display of the smart phone and thus scanned by the scanner 48. The token can be a bar code, a quick response (QR) code, a number, a string of alphanumeric characters, a weblink, or some other symbolic indicia. The exemplary scanner 48 is configured to transmit any scanned data to the computing device 12, which can direct the scanned away from the ATM 10 during the completion of a financial transaction.

Figure 2:
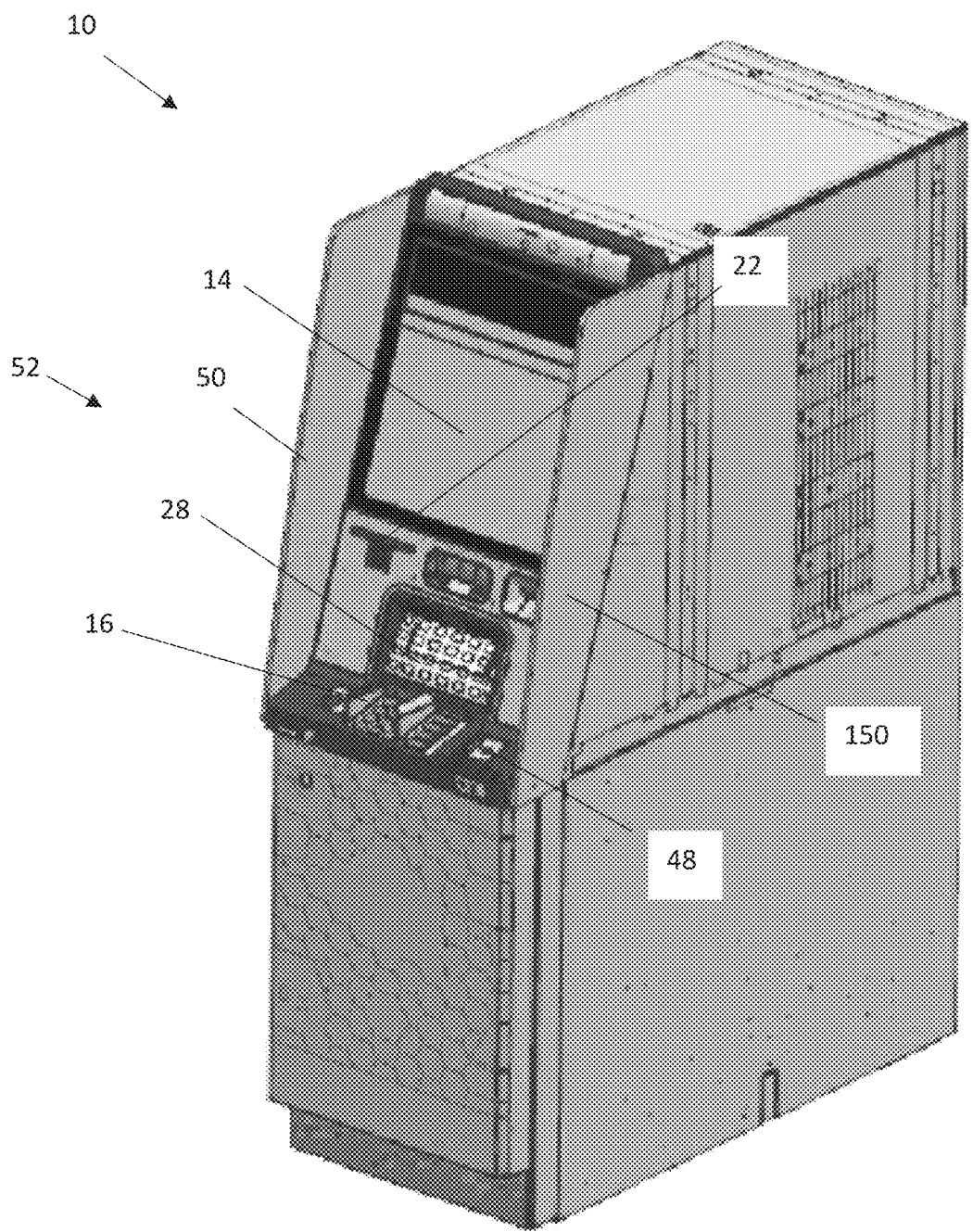
FIG. 2 is a perspective view of an embodiment of the exemplary ATM shown schematically in FIG. 1, wherein the exemplary ATM includes privacy panels.

FIG. 2 illustrates a physical embodiment of the ATM 10. The exemplary ATM 10 includes with privacy panels 50, 150. The exemplary privacy panels 50, 150 operate similarly. The ATM 10 has a user interface 52 which can be defined by any of the group of the display 14, keypad 16, card reader 22, and the scanner 48. A user input can be received from a user through any of the exemplary user interfaces. The respective user interface can then direct the user input to the computing device 12 for processing, such as the completion of a transaction. The privacy panel 50 can hinder viewing of the user interface 52 by a person that is not using the ATM 10. The privacy panel 50 can be constructed of materials that are at least selectively optically opaque to provide privacy for the user of the ATM 10. In the present disclosure, it is desirable for the privacy panel 50 to be transparent during certain operating conditions, such as when the ATM 10 is not in use. It can also be desirable for the privacy panel 50 to be configured to provide illumination during certain operating conditions, such as when the ATM 10 is or is not in use.

Figure 3:
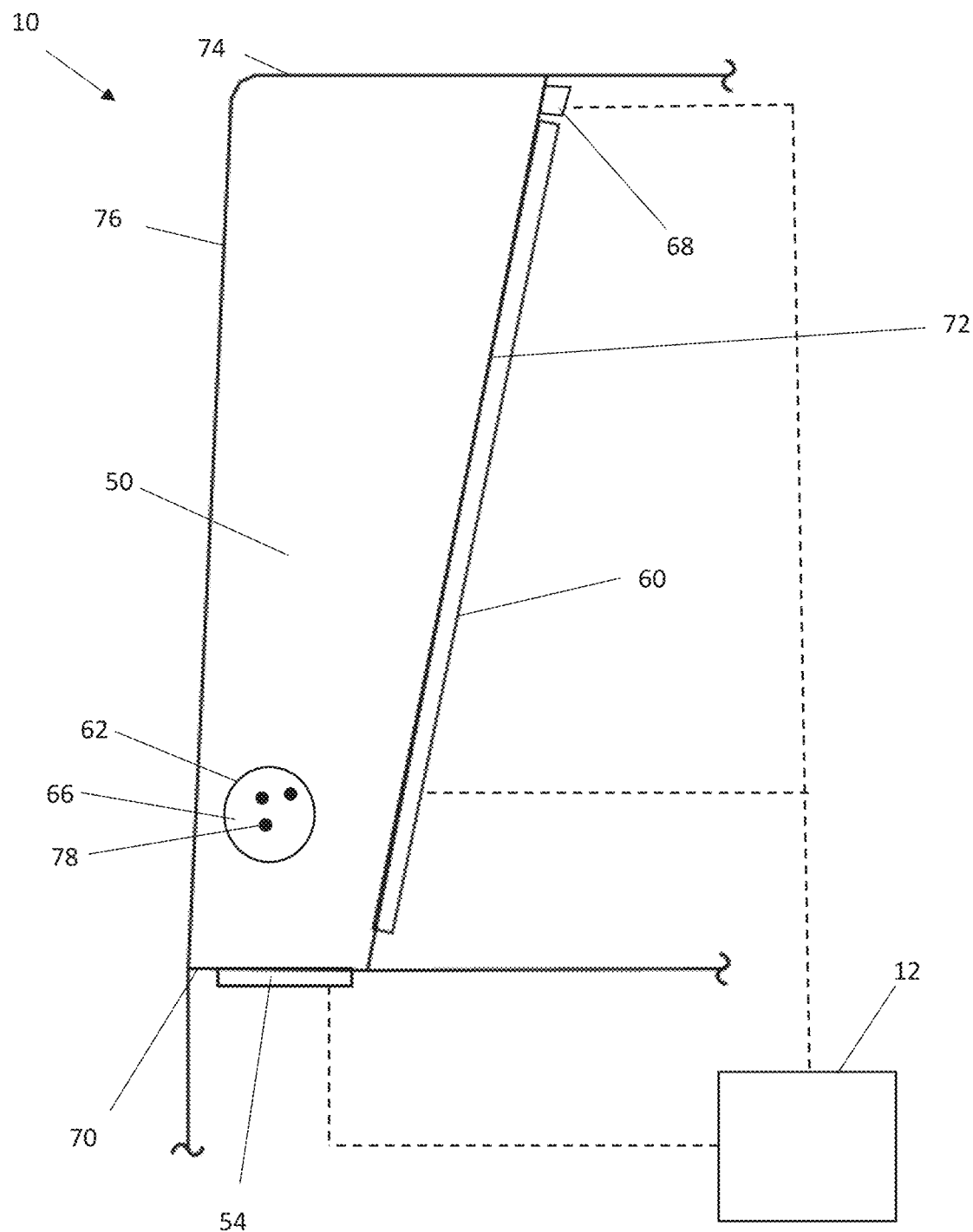
FIG. 3 is a partial cross-section through the exemplary ATM and a side view of an exemplary embodiment of a privacy panel.

An example of a material suitable for application as a privacy panel 50 in the present disclosure is PLEXIGLAS® LED, available from Axis GmbH & Co. KG. PLEXIGLAS® LED is operable to be optically transparent when not illuminated and then be at least somewhat opaque when illuminated. This capacity is achieved by diffuser particles embedded in the PLEXIGLAS® LED. In FIG. 3, a magnified portion of the privacy panel 50 is shown in detail circle 62. The detail circle 62 shows that the exemplary privacy panel 50 includes a transparent panel portion 66 and a plurality of diffuser particles (such as particle 78) embedded within the transparent panel portion 66. These particles scatter light rays from light sources that direct light into the privacy panel 50. Such light sources, by way of example and not limitation, can be positioned at an edge of the privacy panel 50 and be controlled by the computing device 12. If the diffuser particles are illuminated with sufficient light from a light source, the light will be scattered by the diffuser particles, the extent of opacity of the privacy panel will increase, and thus visibility through the privacy panel will be reduced. Further, because of the reduced transparency (increased opacity) of the privacy panel 50, privacy is enhanced for a user of the ATM 10.

Another potential embodiment for creating privacy with a variably transparent/opaque panel includes, for example, the use of Polymer Dispersed Liquid Crystal (PDLC) films. These films are available, for example, from Saint-Gobain (Compagnie de Saint-Gobain S.A.) and are constructed of droplets of liquid crystal material embedded in a polymer matrix between two thin polymer films. The PDLC films operate such that when no electric field is applied, the films are opaque, but when an electric field is applied, the films become transparent. The application of an electric field can be controlled by the computing device 12. If, for example, a PDLC film is used, a PDLC driver circuit can be operatively attached to a PDLC film (not shown) that can be co-planar with privacy panel 50 and can be operatively connected to computing device 12 such that the PDLC film can selectively switch into an optically clear or opaque state. Thus, in one or more embodiments of the present disclosure, a privacy panel can include a transparent base layer and a PDLC film overlaying the transparent base layer.

FIG. 3 is a partial cross-section through the exemplary ATM 10 and a side view of the exemplary privacy panel 50. The exemplary ATM 10 includes lighting elements 54 and 60. The first lighting element 54 and the second lighting element 60 are positioned on adjacent, traverse edges of the transparent panel portion 66. Bottom lighting element 54 and rear lighting element 60 can be constructed of a string of Light Emitting Diodes (LEDs) or any other type of lighting elements known in the art. One or both of the lighting elements 54 and 60 can be a strip of LEDs of multiple colors, such as red, green, and blue. The exemplary lighting element 54 is directed at a bottom edge 70 of the privacy panel 50 and the exemplary lighting element 60 is directed at a side edge 72 of the panel 50. The edges 70, 72 can be different than other edges 74, 76 of the panel 50 to enhance the flow of light into the panel, while the edges 74, 76 can be configured to enhance the reflection of light back into the panel 50. One or more other embodiments of the present disclosure can include lighting elements positioned at edges 74, 76.

Lighting elements 54 and 60 can be selectively energized and controlled by computing device 12 to direct light into privacy panel 50. When one of the lighting elements 54 or 60 is energized and is emitting light, the extent of opacity of the privacy panel 50 increases. When both of the lighting elements 54 or 60 are energized and are emitting light, the extent of opacity of the privacy panel 50 further increases. In addition, the privacy panel 50 can emit at least some light when light is directed into the privacy panel 50. The lighting elements 54 and 60 can be energized by computing device 12 to illuminate privacy panel 50 with multiple colors. For example, lighting elements 54 and 60 can both illuminate the privacy panel 50 with one or more colors such as red, green, or blue, or some variant in between these such as violet or yellow by varying the intensity of the individual LED devices used in lighting elements 54 and 60. The illuminated color can correspond to a particular state of the ATM 10. For example, if the ATM is not currently in use, the computing device 12 can energize either one or both of lighting elements 54, 60 to illuminate privacy panel 50 with either a static color or through a sequence of colors in order to attract potential users to the ATM 10. The static color or sequence of colors can be representative of the brand of the ATM operator, such as a particular financial institution. Likewise if the ATM is in use, for example in a financial transaction, the panels can be illuminated with a particular color or sequence of colors that most effectively inhibits viewing of the user interface 52 from a non-user standing laterally to the user interface 52.

Figure 4:
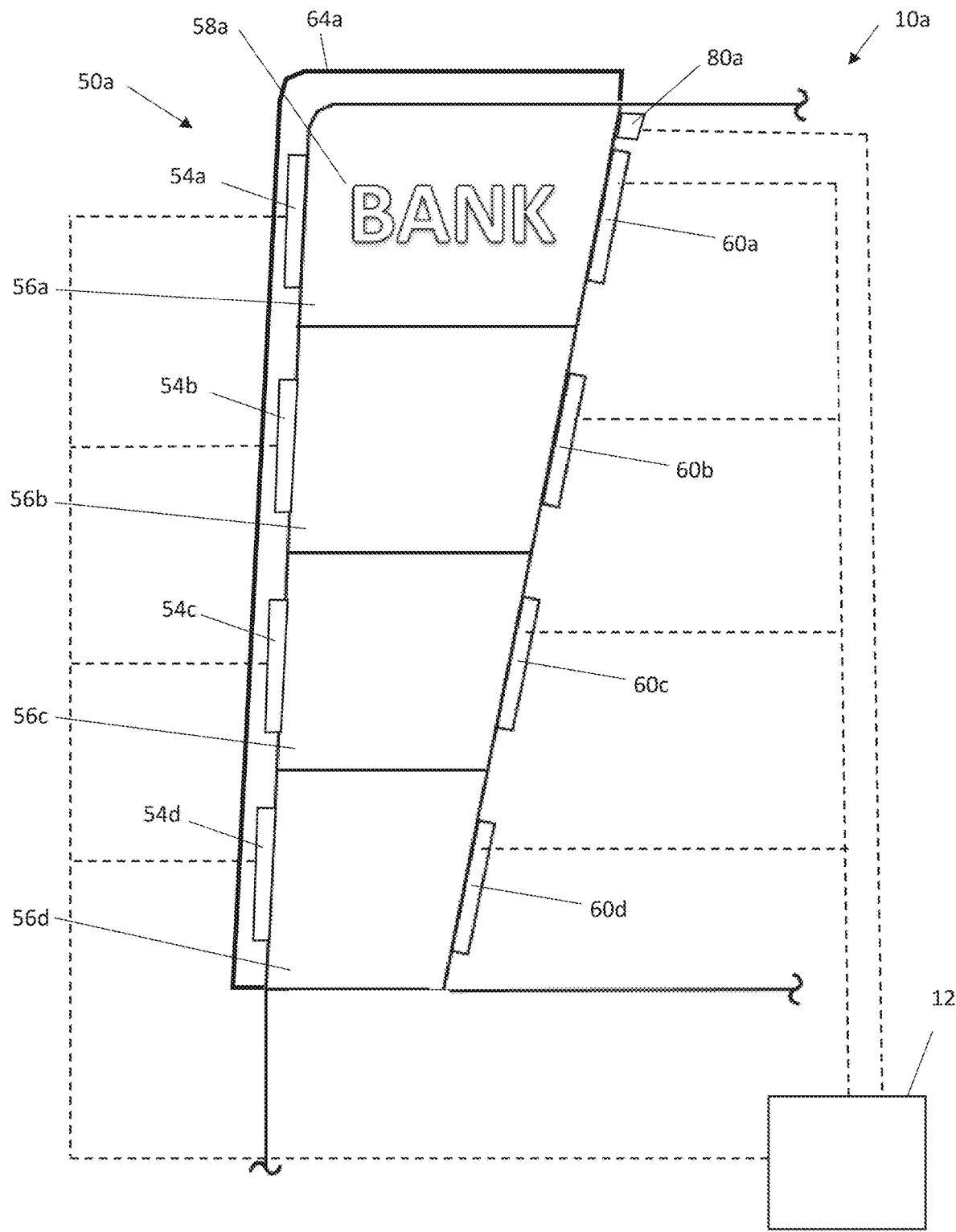
FIG. 4 is a partial cross-section through another exemplary ATM and a side view of another exemplary embodiment of a privacy panel.

FIG. 4 is similar to FIG. 3 but of an alternative embodiment of the present disclosure. In FIG. 4, an ATM 10a includes a privacy panel 50a. The exemplary privacy panel 50a includes subpanels 56a-d. As shown in FIG. 4, the subpanels 56a-56d are vertically stacked from a lowermost panel being the subpanel 56d to an uppermost panel being the subpanel 56a. As shown by FIGS. 2 and 4 cooperatively, the subpanel 56d is horizontally adjacent to the at least one user interface defined by the keyboard 16. The subpanels 56a-d can be constructed of the materials described above relative to the privacy panel 50. Each of the subpanels 56a-d can be illuminated by a corresponding lighting element 60a-d, which can be configured to direct light into an edge of the corresponding subpanel 56a-d. Each of the subpanels 56a-d can also be illuminated by a corresponding lighting element 54a-d, which can be configured to direct light into an edge of the corresponding subpanel 56a-d. The first lighting element 54a and the second lighting element 60a are positioned on opposite edges of the transparent panel portion 58a and confront one another. The computing device 12 is operatively connected to lighting elements 60a-d and 54a-54d. The computing device 12 can selectively energize the lighting elements 60a-d and 54a-d so that one or more of the subpanels 56a-d are receiving light.

The privacy panel 50a can also include bezel 64a surrounding the subpanels 56a-d for mechanical reinforcement. The bezel 64a can also enclose the lighting elements 54a-b. The privacy panel 50a can also include an etching pattern, such as exemplary pattern 58a. The pattern 58a forms the term "BANK" and will distinctively illuminate when light is directed into the subpanel 56a. The first lighting element 54a and the second lighting element 60a are positioned on opposite sides of the etched pattern 58a and are directed at the etched pattern 58a. Although shown in this embodiment as text, pattern 58a can be embodied as any type of design, pattern, company logo, or otherwise. While pattern 58a is shown as located on the surface of subpanel 56a, patterns can also be located on any subpanel 56b-d, and can likewise be located on privacy panel 50 shown in FIG. 3.

The exemplary ATM 10 also includes an ambient light sensor 68. The sensor 68 can communicate with the at least one computing device 12. The ambient light sensor 68 can sense the level of ambient light around the ATM 10 and emit a signal that corresponds to the sensed level of ambient light. The at least one computing device 12 can be configured to control one or more of the lighting elements 54, 60 to emit light in response to a signal received from sensor 68.

The computing device 12 can control the various lighting elements 54, 60 to operate in various ways. For example, in one embodiment, the computing device 12 can control at least one of the lighting elements 54, 60 to emit light in response to receipt of the user input by the at least one computing device. When a user engages one of the user interfaces, one or both of the lighting elements 54, 60 can then be activated to render the privacy panel more opaque.

In another example, the computing device 12 can control at least one of the lighting elements 54, 60 to emit light in response to receipt of the signal from the ambient light sensor 68. When the environment around the ATM 10 is dark, the one or both of the lighting elements 54, 60 can be activated to brighten the user interfaces since some light will escape the privacy panel 50.

The computing device 12 can control the lighting elements 54a-d and 60a-d to emit light in response to various operating conditions. For example, the computing device 12 can control less than all of the lighting elements 54a-d and 60a-d to emit light when a user is executing a transaction. In one or more embodiments of the present disclosure, one or more the lighting elements 54b-d and 60b-d can be on the side of the particular user interface utilized by the user and those lighting elements can be energized to make the respective subpanel 56b-d more opaque. The elements 54a and 60a can be deenergized so that the user can maintain peripheral vision around the ATM 10.

The computing device 12 can control the lighting elements 54, 60 to emit light differently when a transaction has been completed and a user is not present at the ATM 10. For example, the elements 54a and 60a can be energized at such time so that potential users more easily locate the ATM 10 while the lighting elements 54b-d and 60b-d are deenergized. When a new user engages one of the user interfaces, the computing device 12 can then deenergize the elements 54a and and energize the lighting elements 54b-d and 60b-d.

One or more of the lighting elements 54, 60, 54a-d, 60a-d can be configured to selectively emit differently colored light. The computing device 12 can control one or more of the lighting elements 54, 60, 54a-d, 60a-d to emit differently colored light at the same time or at different times under different operation conditions. For example, the computing device 12 can control one or more of the lighting elements 54, 60, 54a-d, 60a-d to emit light of a first color in response to receipt of the user input and to emit light of a second color different than the first color upon completion of a transaction.

As referenced in FIG. 4, the ATM 10a can include an intrusion sensor 80a. The sensor 80a can communicate with the at least one computing device 12. The intrusion sensor 80a can sense conditions indicative of an attempt to gain entry into the internal compartments of the ATM 10a. Such conditions include vibration and noise about predetermined levels. The at least one computing device 12 can be configured to control one or more of the lighting elements 54a-d, 60a-d to emit light in response to a signal received from sensor 80a. For example, the computing device 12 can control the lighting elements 54a-d, 60a-d to emit red light in response to a signal received from sensor 80a. Further, the computing device 12 can control the lighting elements 54a-d, 60a-d to emit red light in a flashing or strobing sequence in response to a signal received from sensor 80a. Conversely, when a user is completing a transaction at the ATM 10a, the computing device 12 can control the lighting elements 54a-d, 60a-d to emit white light to increase the opacity of the subpanels 56a-d.

While the present disclosure has been described with reference to an exemplary embodiment, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the appended claims. The right to claim elements and/or subcombinations that are disclosed herein is hereby unconditionally reserved. The use of the word "can" in this document is not an assertion that the subject preceding the word is unimportant or unnecessary or "not critical" relative to anything else in this document. The word "can" is used herein in a positive and affirming sense and no other motive should be presumed. More than one "invention" may be disclosed in the present disclosure; an "invention" is defined by the content of a patent claim and not by the content of a detailed description of an embodiment of an invention.

What is claimed is:

1. A method of operating an automated transaction machine (ATM) comprising:
   receiving a user input through at least one user interface of the ATM;
   directing the user input to at least one computing device of the ATM arranged in communication with said at least one user interface;
   receiving the user input with the at least one computing device after said directing; disposing at least one privacy panel along a side of said user interface and also along a side of a display of the ATM;
   positioning at least one lighting element at an edge of the at least one privacy panel; and controlling the at least one lighting element, with the at least one computing device, to direct light of a first color and light of a second color into the edge of the at least one privacy panel, wherein the at least one lighting element is further defined as configured to selectively emit differently colored light; and receiving, at the at least one computing device, a signal from an intrusion sensor corresponding to an attempted intrusion of the ATM by a perpetrator; and controlling, with the at least one computing device, the at least one lighting element to emit light of a first color in response to receipt of the user input during said receiving the user input with the at least one computing device and to emit light of a second color different than the first color in response to receipt of the signal from the intrusion sensor during said receiving the signal from the intrusion sensor with the at least one computing device.

2. The method of claim 1 wherein said controlling is further defined as:
controlling the at least one lighting element, with the at least one computing device, to emit light in response to the receipt of the user input by the at least one computing device.

3. The method of claim 1 further comprising:
receiving, at the at least one computing device, a signal from an ambient light sensor corresponding to a predetermined level of ambient light; and
controlling the at least one lighting element, with the at least one computing device, to emit light in response to receipt of the signal.

4. The method of claim 1 further comprising:
forming the at least one privacy panel as a plurality of subpanels interconnected with one another, wherein the at least one lighting element is further defined as a plurality of lighting elements each individually positioned at a respective edge of one of the plurality of subpanels; and
wherein said controlling is further defined as controlling, with the at least one computing device, less than all of the plurality of lighting elements to emit light in response to receipt of the user input by the at least one computing device.

5. The method of claim 4 wherein:
said forming is further defined as forming the at least one privacy panel with plurality of subpanels interconnected with one another and vertically stacked from a lowermost subpanel to an uppermost subpanel;
said receiving is further defined as receiving, through the at least one user interface that is horizontally adjacent to a first subpanel of the plurality of subpanels, a user input; and
said controlling is further defined as:
energizing a first of the plurality of lighting elements that is individually positioned at the edge of the first subpanel of the plurality of subpanels to emit light in response to receipt of the user input by the at least one computing device, and
maintaining, during said energizing, a second of the plurality of lighting elements that is individually positioned at a respective edge of a second subpanel of the plurality of subpanels in a deenergized condition, the second subpanel vertically above the first subpanel.

6. The method of claim 1 further comprising: forming the at least one privacy panel as a plurality of subpanels interconnected with one another, wherein the at least one lighting element is further defined as a plurality of lighting elements each individually positioned at a respective edge of one of the plurality of subpanels;
completing, with the at least one computing device, a transaction; and
wherein said controlling is further defined as controlling, with the at least one computing device, less than all of the plurality of lighting elements to emit light of a first color in response to said receiving the user input with the at least one computing device and of a second color after completion of the transaction during said completing.

7. The method of claim 1 further comprising:
forming the at least one privacy panel as a plurality of subpanels interconnected with one another, wherein the at least one lighting element is further defined as a plurality of lighting elements each individually positioned at a respective edge of one of the plurality of subpanels, at least two of the plurality of lighting elements configured to selectively emit differently colored light; and
wherein said controlling is further defined as controlling, with the at least one computing device, the at least two of the plurality of lighting elements to emit differently colored light at the same time by varying the respective intensities of the at least two of the plurality of lighting elements.

8. The method of claim 1 wherein the at least one lighting element is further defined as configured to selectively emit differently colored light and further comprising:
completing, with the at least one computing device, a transaction; and
wherein said controlling is further defined as controlling, with the at least one computing device, the at least one lighting element to emit light of a first color in response to receipt of the user input during said receiving the user input with the at least one computing device and to emit light of a second color different than the first color upon completion of the transaction during said completing.

9. The method of claim 1 wherein said controlling is further defined as:
controlling the at least one lighting element, with the at least one computing device, the at least one lighting element to direct light of a first color into the edge of the at least one privacy panel and light of a second color into the edge of the at least one privacy panel at the same time.

10. The method of claim 1 wherein said controlling is further defined as:
controlling the at least one lighting element, with the at least one computing device, the at least one lighting element to direct light of a first color into the edge of the at least one privacy panel and light of a second color into the edge of the at least one privacy panel at different times.

11. The method of claim 1 wherein said controlling is further defined as:
controlling the at least one lighting element, with the at least one computing device, the at least one lighting element to direct light of a sequence of colors into the edge of the at least one privacy panel when the ATM is not in use and light of a second, static color into the edge of the at least one privacy panel when the ATM is in use.

12. The method of claim 1 wherein said controlling is further defined as:

controlling the at least one lighting element, with the at least one computing device, the at least one lighting element to direct light of a sequence of colors into the edge of the at least one privacy panel when the ATM is in use and light of a second, static color into the edge of the at least one privacy panel when the ATM is not in use.

13. The method of claim 1 wherein said controlling is further defined as:
controlling the at least one lighting element, with the at least one computing device, the at least one lighting element to direct light of a color that inhibits viewing of the user interface by a non-user standing laterally to the user interface.

14. The method of claim 1 further comprising:
controlling, with the at least one computing device, the at least one privacy panel to change the opacity of the at least one privacy panel.

15. The method of claim 1 wherein said controlling is further defined as:
controlling, with the at least one computing device, the at least one lighting element to emit light of the second color in a flashing pattern in response to receipt of the signal from the intrusion sensor during said receiving the signal from the intrusion sensor with the at least one computing device.

\* \* \* \* \*